United States Patent
Shabtay et al.

(10) Patent No.: US 12,309,976 B2
(45) Date of Patent: May 20, 2025

(54) NETWORK INTERFACE DEVICE HAVING HEAT DISSIPATING MEMBERS

(71) Applicant: Mellanox Technologies Ltd., Yokneam (IL)

(72) Inventors: Ayal Shabtay, Haifa (IL); Alon Rokach, Haifa (IL); Bar Noyman, Kibbutz Kfar Hachoresh (IL); Jamal Mousa, Haifa (IL); Nimer Hazin, Bi'ina (IL); Rom Becker, Ramat Yishai (IL)

(73) Assignee: Mellanox Technologies Ltd., Yokneam (IL)

( * ) Notice: Subject to any disclaimer, the term of this patent is extended or adjusted under 35 U.S.C. 154(b) by 599 days.

(21) Appl. No.: 17/517,007

(22) Filed: Nov. 2, 2021

(65) Prior Publication Data
US 2023/0137375 A1    May 4, 2023

(51) Int. Cl.
*H05K 7/20*      (2006.01)
*H01R 13/66*    (2006.01)

(52) U.S. Cl.
CPC ....... *H05K 7/20409* (2013.01); *H01R 13/665* (2013.01)

(58) Field of Classification Search
CPC .......... H05K 7/20409; H05K 7/20436; H01R 13/665; G02B 6/4261; G02B 6/4269; H04B 1/036
See application file for complete search history.

(56) References Cited

U.S. PATENT DOCUMENTS

| | | | |
|---|---|---|---|
| 9,389,368 B1 * | 7/2016 | Sharf | H01R 13/6587 |
| 2016/0211623 A1 * | 7/2016 | Sharf | G02B 6/4269 |
| 2020/0150366 A1 * | 5/2020 | Tittenhofer | G02B 6/4278 |
| 2020/0221607 A1 * | 7/2020 | Bucher | H01R 12/716 |
| 2020/0309458 A1 * | 10/2020 | Chen | H01L 23/3675 |

* cited by examiner

*Primary Examiner* — Michael C Zarroli
(74) *Attorney, Agent, or Firm* — PEARL COHEN ZEDEK LATZER BARATZ LLP

(57) ABSTRACT

A network interface device may include: a frame having: a first frame end, a second frame end, a top frame surface, a bottom frame surface, a first lateral frame surface and a second lateral frame surface, wherein the top frame surface includes a longitudinal frame indent extending along a portion of the top frame surface and between the first lateral frame surface and the second lateral frame surface; and heat dissipating members protruding from the longitudinal frame indent of the top frame surface.

18 Claims, 6 Drawing Sheets

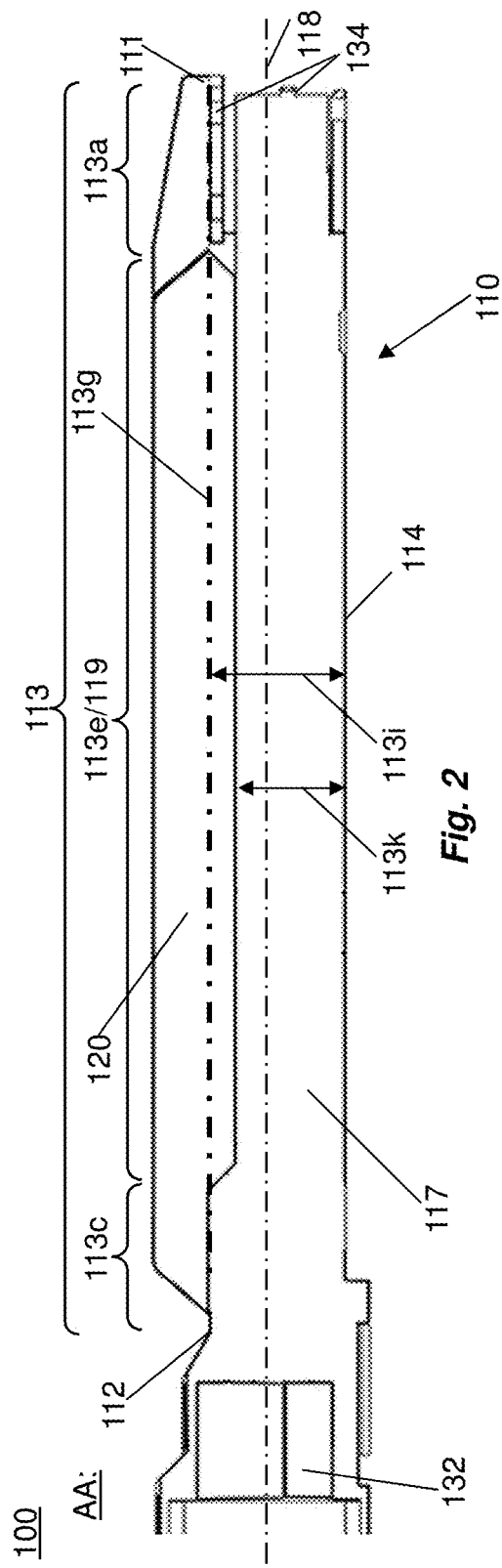
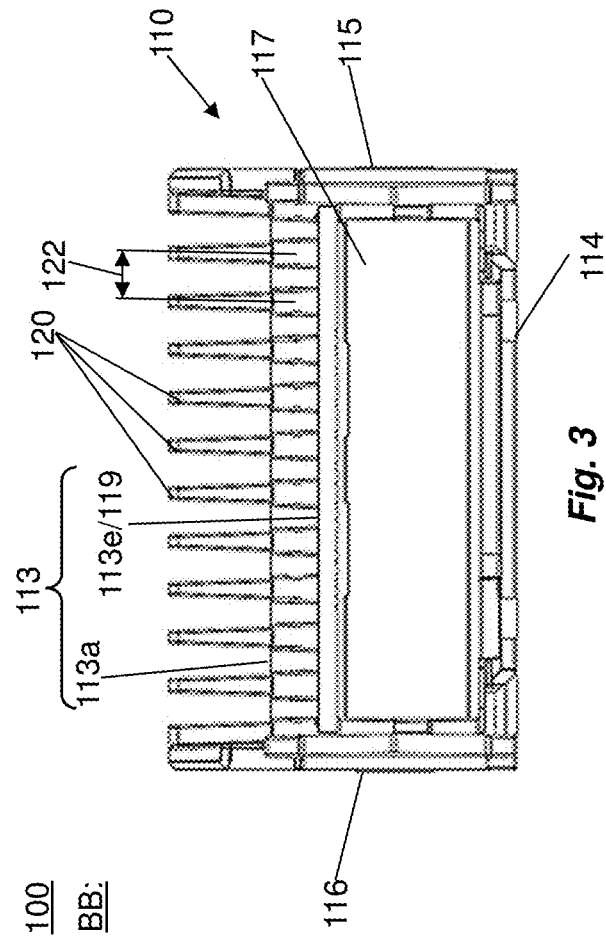

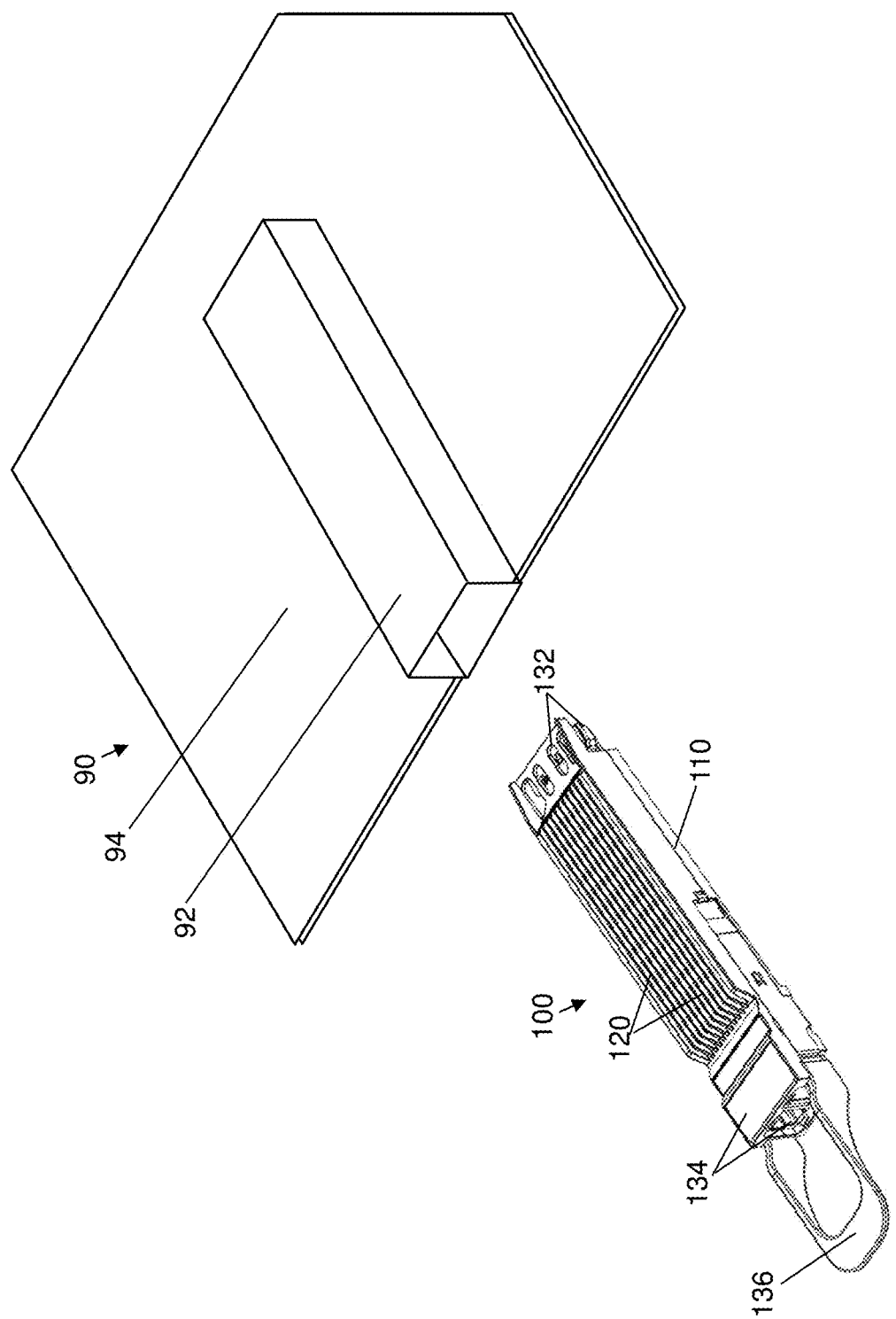

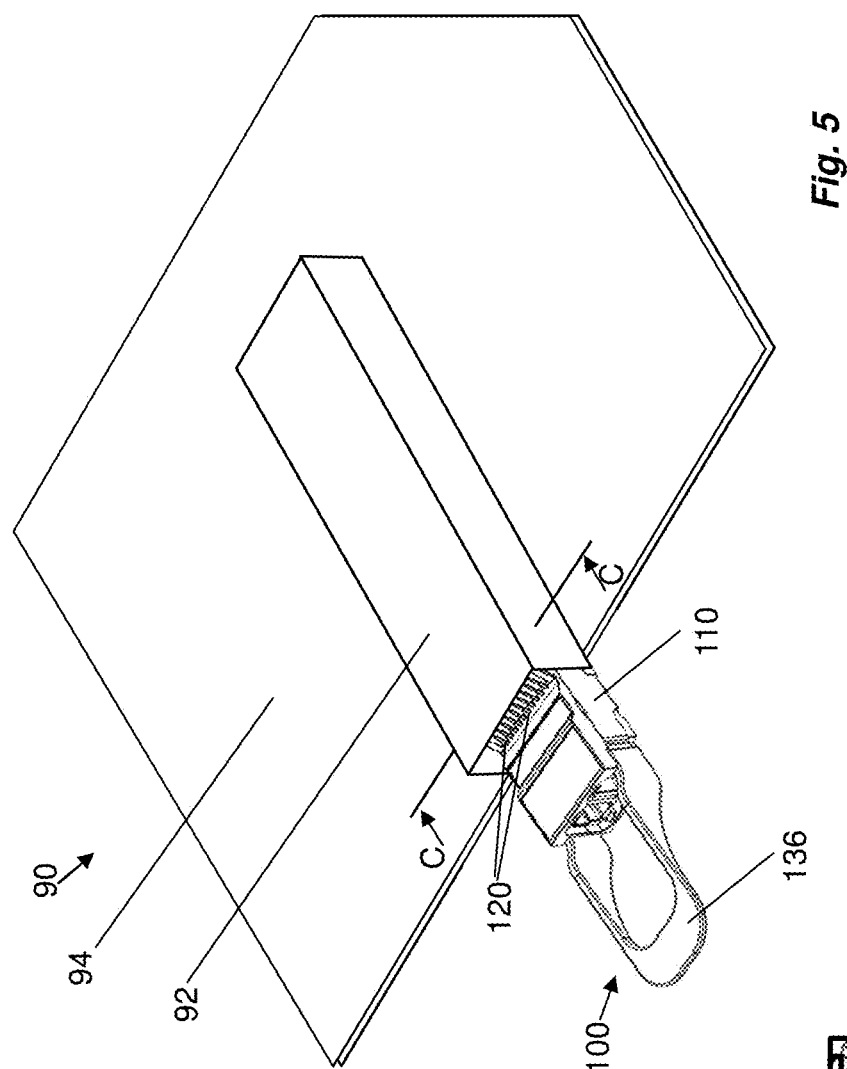
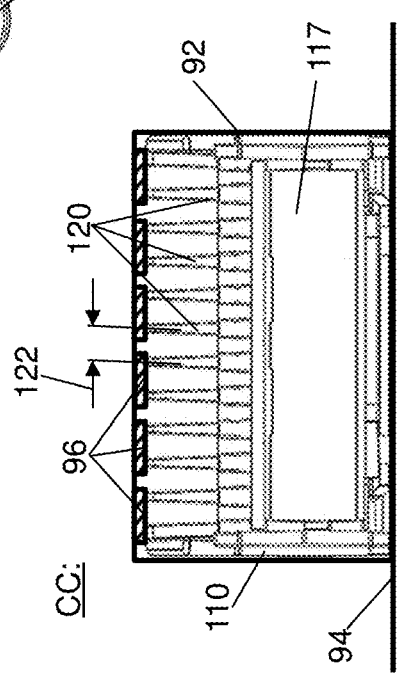
Fig. 5
Fig. 6

NETWORK INTERFACE DEVICE HAVING HEAT DISSIPATING MEMBERS

FIELD OF THE INVENTION

The present invention relates to the field of network interface devices, and more particularly, to network interface devices having heat dissipation members.

BACKGROUND OF THE INVENTION

Network interfaces devices, for example small form-factor pluggable (SFP) devices, are typically used in data communication systems, for example in switch devices of data communication systems and other devices known in the art. In operation, such network interface devices typically produce heat that may cause reduction in their performance

SUMMARY OF THE INVENTION

Some embodiments of the present invention may provide a network interface device including for example a frame having: a first frame end, a second frame end, a top frame surface, a bottom frame surface, a first lateral frame surface and a second lateral frame surface, wherein the top frame surface comprises a longitudinal frame indent extending along a portion of the top frame surface and between the first lateral frame surface and the second lateral frame surface; and heat dissipating members protruding from the longitudinal frame indent of the top frame surface.

In some embodiments, the heat dissipating members may extend above a plane of the top frame surface.

In some embodiments, the heat dissipating members may be longitudinal fins that are parallel to a central longitudinal frame axis extending between the first frame end and the second frame end. The longitudinal fins may be perpendicular to the top frame surface. The longitudinal fins may extend above a plane of at least one of the first longitudinal portion and the second longitudinal portion of the top frame surface.

In some embodiments, the longitudinal fins may be spaced by a fin pitch with respect to each other, and wherein the fin pitch is predefined such that each of the longitudinal fins contacts one of conductive members of a receptacle cage of a data communication system when the network interface device is inserted into the receptacle cage.

In some embodiments, the longitudinal fins have a trapezoidal cross-sectional shape. In some embodiments, the longitudinal fins have a rectangular cross-sectional shape.

In some embodiments, the heat dissipating members and at least the top frame surface may be formed of one piece.

In some embodiments, the heat dissipating members may be welded or soldered to the top frame surface.

In some embodiments, the network interface device may include a data communication system connector positioned at the first frame end to connect the network interface device to a data communication system.

In some embodiments, the network interface device may include a cable connector positioned at the second frame end to connect a cable to the network interface device.

In some embodiments, the network interface device may include electronic components within a hollow interior of the frame.

In some embodiments, the network interface device may include a handle positioned at the second frame end.

Some embodiments of the present invention may provide a network interface device including a frame having: a first frame end, a second frame end, a top frame surface, a bottom frame surface, a first lateral frame surface and a second lateral frame surface, wherein the top frame surface may include: a first longitudinal portion comprising or adjacent to the first frame end, a second longitudinal portion comprising or adjacent to the second end, and a third longitudinal portion disposed between the first longitudinal portion and the second longitudinal portion and offset with respect to the first longitudinal portion and the second longitudinal portion towards the bottom frame surface to form a longitudinal frame indent; and heat dissipating members protruding from the third longitudinal portion of the top frame surface.

In some embodiments, at least one of the first longitudinal portion and the second longitudinal portion of the top frame surface is disposed along a first plane positioned at a first height relative to the bottom frame surface, the third longitudinal portion of the top frame surface is disposed along a second plane positioned at a second height relative to the bottom frame surface, and the first height being higher than the second height.

In some embodiments, the heat dissipating members extend above a plane of at least one of the first longitudinal portion and the second longitudinal portion of the top frame surface.

In some embodiments, the heat dissipating members may include longitudinal fins being spaced by a fin pitch with respect to each other, and wherein the fin pitch is predefined such that each of the longitudinal fins contacts one of conductive members of a receptacle cage of a data communication system when the network interface device is inserted into the receptacle cage.

In some embodiments, the heat dissipating members may include a zipper fins assembly.

In some embodiments, the heat dissipating members and at least the top frame surface are formed of one piece.

In some embodiments, the heat dissipating members are welded or soldered to the top frame surface.

In some embodiments, the network interface device may include a data communication system connector positioned at the first frame end to connect the network interface device to a data communication system.

In some embodiments, the network interface device may include a cable connector positioned at the second frame end to connect a cable to the network interface device.

In some embodiments, the network interface device may include electronic components within a hollow interior of the frame.

In some embodiments, the network interface device may include a handle positioned at the second frame end.

BRIEF DESCRIPTION OF THE DRAWINGS

For a better understanding of embodiments of the invention and to show how the same can be carried into effect, reference will now be made, purely by way of example, to the accompanying drawings in which like numerals designate corresponding elements or sections throughout.

In the accompanying drawings:

FIG. 2 is a sectional view of the network interface device, according to some embodiments of the invention;

FIG. 3 is a transverse cross-sectional view of the network interface device, according to some embodiments of the invention;

FIGS. 4 and 5 are 3D diagrams of the network interface device and a data communication system having a receptacle cage mounted on a Printed Circuit Board (PCB), according to some embodiments of the invention;

FIG. 6 is a transverse cross-sectional view of the network interface device and the data communication system, according to some embodiments of the invention.

Figure 1:
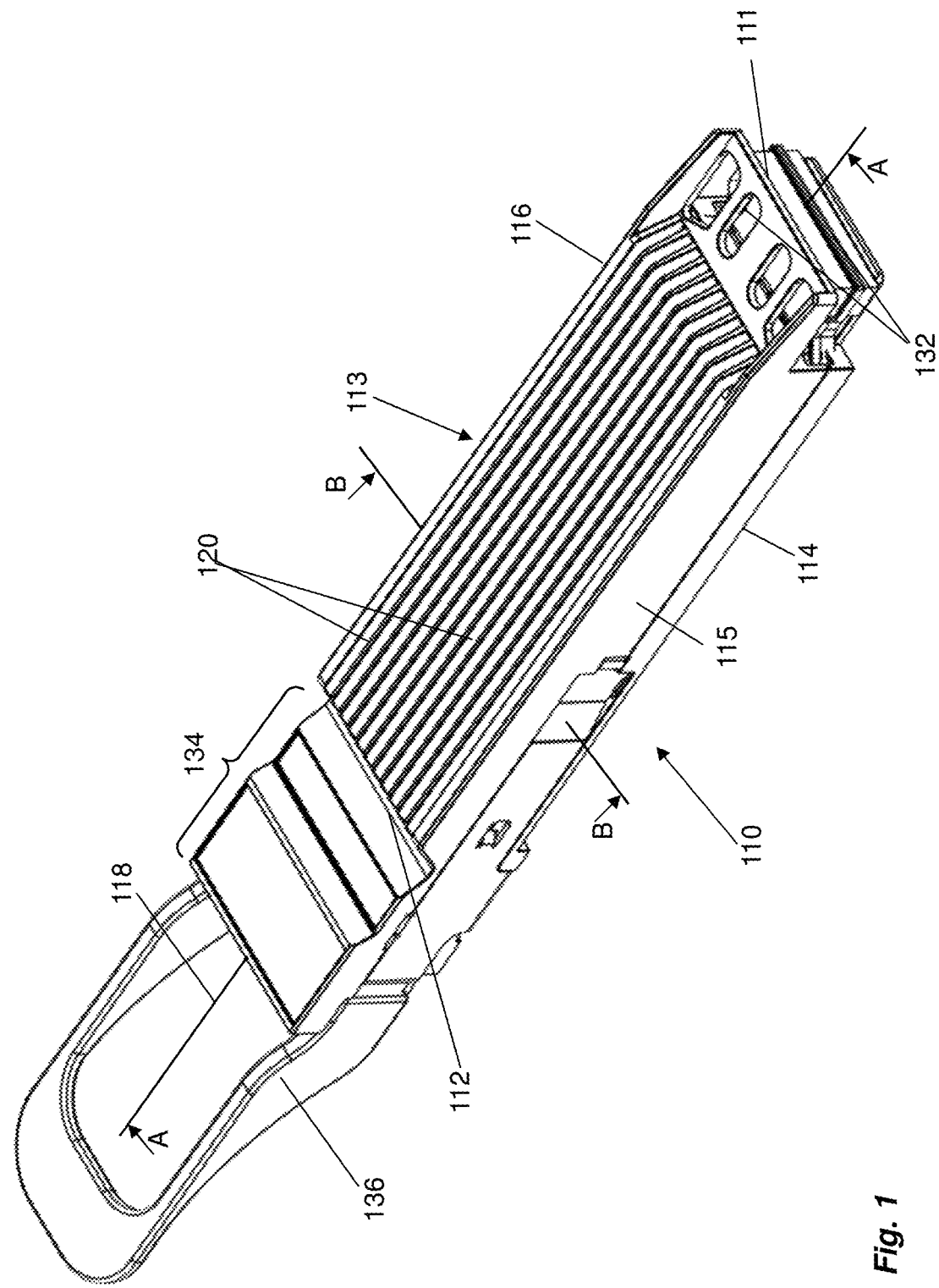
FIG. 1 is a three-dimensional (3D) diagram of a network interface device having heat dissipation members in a form of longitudinal fins, according to some embodiments of the invention.

It will be appreciated that, for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following description, various aspects of the present invention are described. For purposes of explanation, specific configurations and details are set forth in order to provide a thorough understanding of the present invention. However, it will also be apparent to one skilled in the art that the present invention can be practiced without the specific details presented herein. Furthermore, well known features can have been omitted or simplified in order not to obscure the present invention. With specific reference to the drawings, it is stressed that the particulars shown are by way of example and for purposes of illustrative discussion of the present invention only and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention can be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that can be practiced or carried out in various ways as well as to combinations of the disclosed embodiments. Also, it is to be understood that the phraseology and terminology employed herein is for the purpose of description and should not be regarded as limiting.

Reference is now made to FIG. 1, which is a three-dimensional (3D) diagram of a network interface device 100 having heat dissipation members in a form of longitudinal fins 120, according to some embodiments of the invention.

Reference is also made to FIG. 2, which is a sectional view of network interface device 100, according to some embodiments of the invention.

Reference is also made to FIG. 3, which is a transverse cross-sectional view of network interface device 100, according to some embodiments of the invention.

Reference is also made to FIGS. 4 and 5, which are 3D diagrams of network interface device 100 and a data communication system 90 having a receptacle cage 92 mounted on a Printed Circuit Board (PCB) 94, according to some embodiments of the invention.

Reference is also made to FIG. 6, which is a transverse cross-sectional view network interface device 100 and data communication system 90, according to some embodiments of the invention.

According to some embodiments of the present invention, network interface device 100 may include a frame 110 and heat dissipating members 120. Network interface device 100 may be, for example, a pluggable network interface device, such as, e.g., a small form-factor pluggable (SFP) device (e.g., a quad SFP (QSFP) device or an octal SFP (OSFP) device) or any other form-factor device known in the art. Embodiments may include electronic components other than a network interface device including frame and heat dissipating structures as described herein.

Frame 110 of network interface device 100 may include a first frame end 111, a second frame end 112, a top frame surface 113, a bottom frame surface 114, a first lateral frame surface 115 and a second lateral frame surface 116. In some embodiments, frame 110 may have a rectangular (or substantially rectangular) shape. For example, top frame surface 113 and bottom frame surface 114 may be parallel (or substantially parallel) to each other and/or first lateral frame surface 115 and second lateral frame surface 116 may be parallel (or substantially parallel) to each other. Frame 110 may include a hollow (or substantially hollow) frame interior 117. Frame 110 may include a central longitudinal frame axis 118 extending between first frame end 111 and second frame end 112.

Frame 110 may include a longitudinal frame indent 119 extending along a portion of top frame surface 113 and between first lateral frame surface 115 and second lateral frame surface 116. For example, top frame surface 113 may include a first longitudinal portion 113a including or adjacent to first frame end 111, a second longitudinal portion 113c including or adjacent to second frame end 112, and a third longitudinal portion 113e disposed between first and second longitudinal portions 113a, 113c. Third longitudinal portion 113e may be offset or displaced with respect to first and second longitudinal portions 113a, 113c towards bottom frame surface 114 to form longitudinal frame indent 119. For example, first longitudinal portion 113a and/or second longitudinal portion 113c of top frame surface 113 may be disposed along a plane positioned at a first height 113i relative to bottom frame surface 114, and third longitudinal portion 113e of top frame surface 113 may be disposed along a plane positioned at a second height 113k relative to bottom frame surface 114, wherein the first height 113i being higher than the second height 113k. In some embodiments, second height 113k may be at least 40% of first height 113i. For example, second height 113k may be 65% of first height 113i. For example, first height 113i may be at least 10.97 mm. In the same example, second height 113k may be at least 4.5 mm, for example 6.95 mm.

Network interface device 100 may include heat dissipating members or heat dissipating longitudinal fins 120 (e.g., also referred herein as "longitudinal fins 120") protruding from longitudinal frame indent 119 on top frame surface 113. In some embodiments, longitudinal fins 120 and at least top frame surface 113 may be formed of one piece (e.g., a molded piece of metal). In some embodiments, longitudinal fins 120 may be welded or soldered to top frame surface 113. In some embodiments, longitudinal fins 120 may be perpendicular (or substantially perpendicular) to top frame surface 113. For example, longitudinal fins 120 may be perpendicular (or substantially perpendicular) to third longitudinal portion 113e of top frame surface 113. In some embodiments, longitudinal fins 120 may be parallel (or substantially parallel) to central longitudinal frame axis 118. In some embodiments, longitudinal fins 120 may extend from the level of third longitudinal portion 113e to above a height of a plane 113g of first longitudinal portion 113a and/or of second longitudinal portion 113c of top frame surface 113. In some embodiments, longitudinal fins 120 may have a trapezoidal (or substantially trapezoidal) transverse cross-sectional shape when viewed perpendicular to their longitudinal axis. For example, longitudinal fins 120 may have a rectangular (or substantially rectangular) cross-sectional shape. Longitudinal fins 120 may extend upward from a point below (relative to the bottom of device 100) the height of first longitudinal portion 113a and second longitudinal portion 113c.

In some embodiments, network interface device 100 may include electronic components within frame interior 117. In some embodiments, network interface device 100 may include a data communication system connector 132 positioned at first frame end 111 to connect network interface device 100 to data communication system 90. Data communication system connector 132 may, for example, include mechanical and/or electrical connectors. In some embodiments, network interface device 100 may include a cable connector 134 positioned at second frame end 112 to connect network interface device 100 to a cable. Cable connector 134 may, for example, include mechanical and/or electrical connectors. In some embodiments, network interface device 100 may include a handle 136 positioned at second frame end 112.

Typical network interface devices are designed according to a predefined set of technical characteristics. Typical network interface devices and/or any components thereof designed according to the predefined set of technical parameters are referred herein as "standard complaint", "compliant with the standard" or "defined by the standard". The predefined set of technical characteristics may, for example, define external dimensions of typical network interface devices, a height of longitudinal fins of typical network interface devices, a fin pitch, a number of longitudinal fins of typical network interface devices or any other technical characteristics known in the art.

Network interface device 100 according to embodiments of the present invention may have external dimensions that are compliant with external dimensions defined by the standard. Network interface device 100 having standard compliant external dimensions may be inserted into standard cage receptacle 92 of data communication system 90 (e.g., as shown in FIGS. 4, 5 and 6).

For example, network interrace device 100 may have a height (measured from bottom frame surface 114 to top of longitudinal fins 120) ranging between 12.8 mm to 13.1 mm. In the same example, network interface device 100 and/or frame 110 may have a width (measured from first to second longitudinal frame surfaces 114, 115) ranging between 22.57 mm to 22.59 mm. In the same example, frame 110 may have a height (measured from bottom frame surface 114 to first or second longitudinal portions 113a, 113c of top frame surface 113) of at least 10.97 mm. In the same example, network interface device 100 may have a length (measured from first frame end 111 to communication system connector 132 at second frame end 112) smaller than 116.4 mm.

Longitudinal fins 120 of network interface device 100 may protrude from longitudinal frame indent 119/offset third longitudinal portion 113e of top frame surface 113 and may have a height (measured from top to bottom of the fins) determined to conform external transverse dimensions of network interface device 100 with external transverse dimensions defined by the standard. Prior art standard compliant network interface devices have no longitudinal indents on their top frame surfaces. For example, the first, second and third longitudinal portions of the top frame surfaces of prior art standard compliant network interface devices are disposed at the same level or having the same height measured from the bottom frame surfaces thereof. Accordingly, longitudinal fins 120 of network interface device 100 protruding from longitudinal indent 119/offset third longitudinal portion 113e of top frame surface 113 have a height (measured from top to bottom of the fins) that is greater than a height (measured from top to bottom of the fins) of longitudinal fins of prior art standard compliant network interface devices. It is noted that it is not possible to offset or displace the entire top frame surface 113 (extending from first to second frame ends 111, 112) towards bottom frame surface 114 of network interface device 100 at least because first frame end 111 and/or first longitudinal portion 113a of top frame surface 113 having data communication system connector 132 need to have standard compliant external dimensions to connect network interface device 100 to standard data communication system 90. Thus, there is a need for longitudinal frame indent 119 on top frame surface 113 of network interface device 100 to increase the height of longitudinal fins 120 as compared to the height of longitudinal fins of prior art standard compliant network interface devices. The measure of indentation of longitudinal frame indent 119 into top frame surface 110 or the measure of offset of third longitudinal portion 113e with respect to first or second longitudinal frame portions 113a, 113c of top frame surface 113 need to be carefully predefined. For example, the indentation/offset measures may be predefined such that longitudinal frame indent 119 does not reduce (or substantially does not reduce) the efficiency of the air flow between longitudinal fins 120. The indentation/offset measures may be predefined based on, for example, the height of PCB being accommodated within network interface device 100 and/or based on heights of electronic components on the PCB. The indentation/offset measures may be predefined based on, for example, a manufacturing process and/or a material being used to manufacture network interface device 100. Advantageously, network interface device 100 with longitudinal fins 120 having greater height or vertical extent than longitudinal fins of prior art standard compliant network interface devices may have better heat dissipation characteristics as compared to typical standard compliant network interface device. For example, network interface device 100 according to some embodiments of the present invention with longitudinal fins 120 having greater height or vertical extent than longitudinal fins of prior art standard compliant network interface devices may have thermal impedance that is lower by up to 17% as compared to thermal impedance of prior art standard compliant network interface devices.

Longitudinal fins 120 of network interface device 100 according to some embodiments of the present invention may be spaced by a fin pitch 122 with respect to each other. In some embodiments, fin pitch 122 may be smaller than a fin pitch value defined by the standard. For example, fin pitch 122 may be smaller by up to 65% of the fin pitch value defined by the standard. In some embodiments, fin pitch 122 may range between 4% and 14% of a distance between first and second longitudinal frame surfaces 115, 116. Accordingly, in some embodiments, network interface device 100 may have a greater number of longitudinal fins 120 as compared to prior art standard compliant network interface devices. In some embodiments, fin pitch 122 is predefined such that each of longitudinal fins 120 contacts one of conductive members 96 of receptacle cage 92 of data communication system 90 (e.g., as shown in FIG. 6). Advantageously, network interface device 100 having greater number of longitudinal fins 120 than prior art standard compliant network interface devices may have better heat dissipation characteristics as compared to typical standard compliant network interface device.

Advantageously, network interface device 100 according to embodiments of the present invention may have better heat dissipation characteristics as compared to prior art standard compliant network interface device (e.g., as described hereinabove). For example, in operation, network interface device 100 having twelve (12) longitudinal fins 120, instead of eight (8) longitudinal fins as in prior art standard complaint network interface device, that are higher by 43% as compared to longitudinal fins of prior art standard complaint network interface device may have a temperature that is lower by at least 18% as compared to a temperature of prior art standard complaint network interface device in operation.

It is noted that although longitudinal fins 120 are described and shown in FIGS. 1-6, other embodiments of heat dissipating members may be used.

Figure 7A:
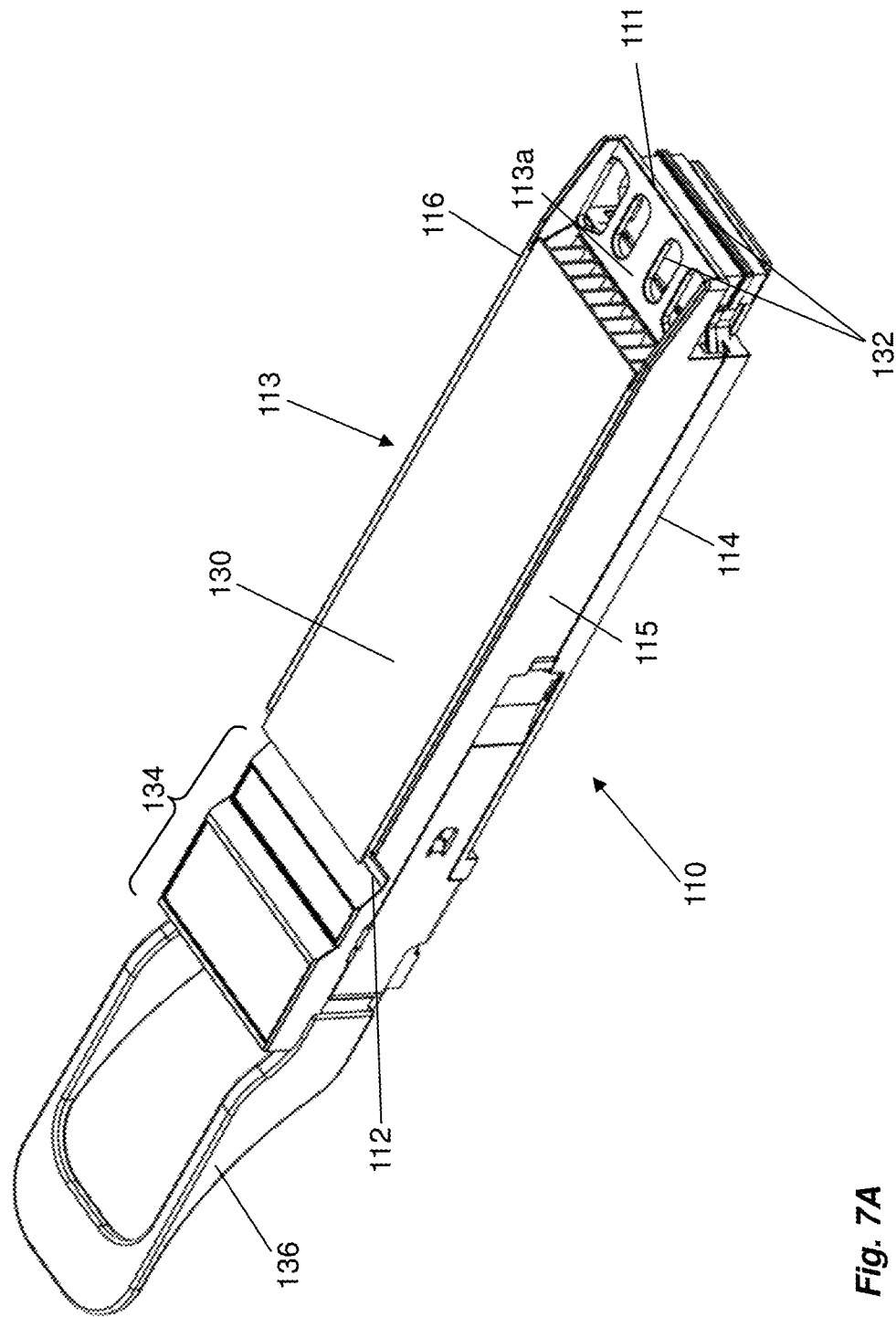
FIGS. 7A and 7B are 3D diagrams of the network interface device having heat dissipating members in a form of zipper fins assembly, according to some embodiments of the invention.
Figure 7B:
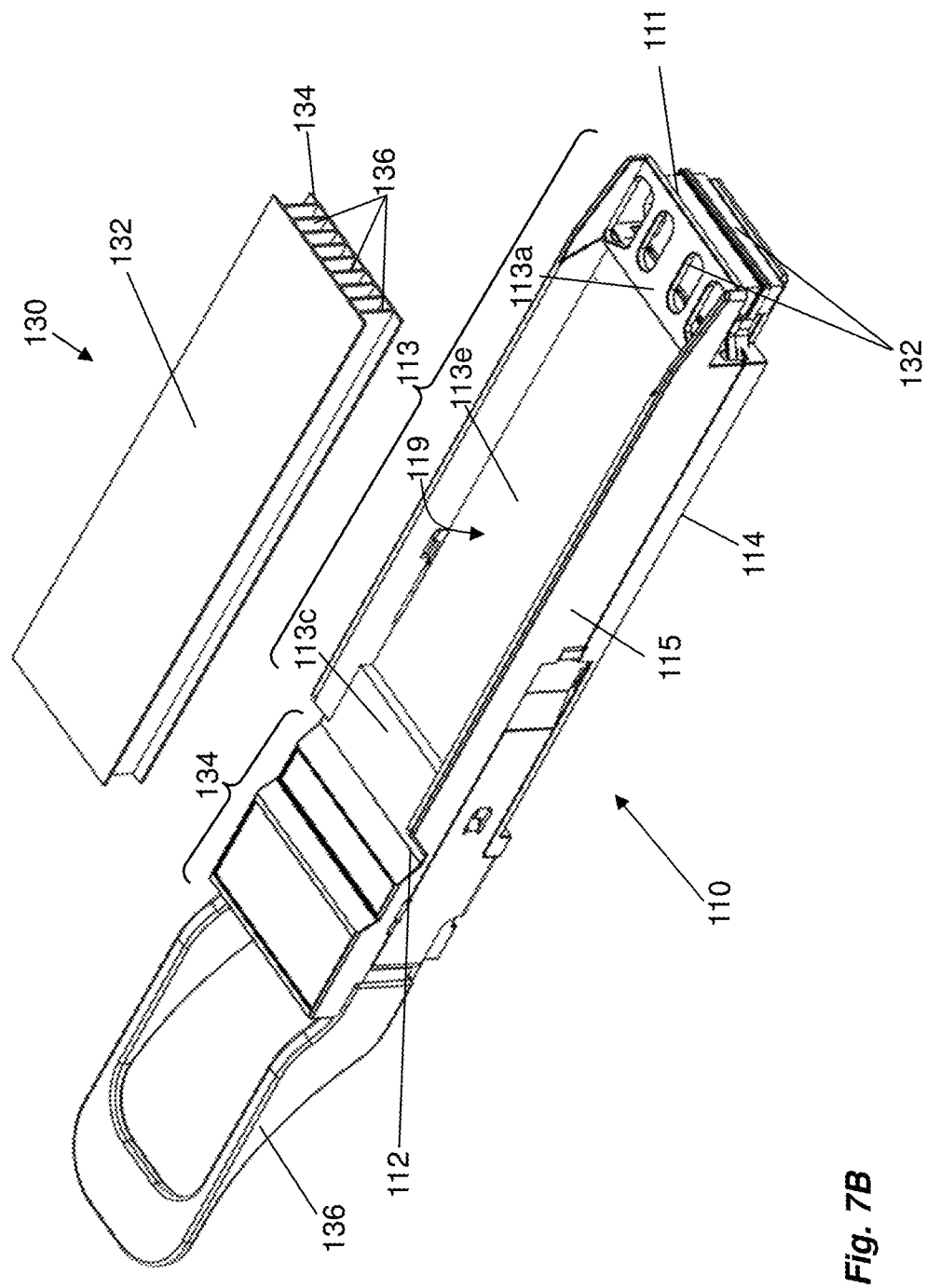

Reference is now made to FIGS. 7A and 7B, which are 3D diagrams of network interface device 100 having heat dissipating members in a form of zipper fins assembly 130, according to some embodiments of the invention. FIG. 7A shows an assembled view of network interface 100. FIG. 7B shows an exploded view of frame 110 and zipper fins assembly 130 of network interface device 100.

Zipper fins assembly 130 may, for example, include a top flat (or substantially flat) surface 132, a bottom flat (or substantially flat) surface 134 and multiple longitudinal members 136 being connected between and perpendicular to top and bottom frame surfaces 132, 134 and spaced with respect to each other. Zipper fins assembly 130 may be, for example, welded or soldered at its bottom flat surface 134 to third longitudinal portion 113e of top frame surface 113 within longitudinal frame indent 119.

When zipper fins assembly 130 being welded or soldered to third longitudinal portion 113e of top frame surface 113 within longitudinal frame indent 119, top flat surface 132 and at least a portion of longitudinal members 136 may extend above a plane of at least one of first longitudinal portion 113a and second longitudinal portion 113c of top frame surface 113.

In the above description, an embodiment is an example or implementation of the invention. The various appearances of "one embodiment", "an embodiment", "certain embodiments" or "some embodiments" do not necessarily all refer to the same embodiments. Although various features of the invention can be described in the context of a single embodiment, the features can also be provided separately or in any suitable combination. Conversely, although the invention can be described herein in the context of separate embodiments for clarity, the invention can also be implemented in a single embodiment. Certain embodiments of the invention can include features from different embodiments disclosed above, and certain embodiments can incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A network interface device comprising:
   a frame having: a first frame end, a second frame end, a top frame surface, a bottom frame surface, a first lateral frame surface and a second lateral frame surface, wherein the top frame surface comprises a longitudinal indent extending longitudinally along a portion of the top frame surface and between the first lateral frame surface and the second lateral frame surface; and
   heat dissipating members protruding from the longitudinal indent of the top frame surface;
   wherein the heat dissipating members are longitudinal fins extending longitudinally between the first frame end and the second frame end; and
   wherein the longitudinal fins are spaced by a fin pitch with respect to each other, and wherein the fin pitch is predefined such that each of the longitudinal fins contacts one of conductive members of a receptacle cage of a data communication system when the network interface device is inserted into the receptacle cage.

2. The network interface device of claim 1, wherein the heat dissipating members extend above a plane of the top frame surface.

3. The network interface device of claim 1, wherein the longitudinal fins are perpendicular to the top frame surface.

4. The network interface device of claim 1, wherein the longitudinal fins have a trapezoidal cross-sectional shape.

5. The network interface device of claim 1, wherein the heat dissipating members and at least the top frame surface are formed of one piece.

6. The network interface device of claim 1, wherein the heat dissipating members are welded or soldered to the top frame surface.

7. The network interface device of claim 1, further comprising a data communication system connector positioned at the first frame end to connect the network interface device to a data communication system.

8. The network interface device of claim 1, further comprising a cable connector positioned at the second frame end to connect a cable to the network interface device.

9. The network interface device of claim 1, further comprising electronic components positioned within a hollow interior of the frame.

10. The network interface device of claim 1, further comprising a handle positioned at the second frame end.

11. A network interface device comprising:
    a frame having: a first frame end, a second frame end, a top frame surface, a bottom frame surface, a first lateral frame surface and a second lateral frame surface, wherein the top frame surface comprises:
a first longitudinal portion comprising or adjacent to the first frame end,
a second longitudinal portion comprising or adjacent to the second end, and
a third longitudinal portion disposed between the first longitudinal portion and the second longitudinal portion and offset with respect to the first longitudinal portion and the second longitudinal portion towards the bottom frame surface to form a longitudinal indent, the longitudinal indent extending longitudinally along a portion of the top frame surface and between the first lateral frame surface and the second lateral frame surface; and
heat dissipating members protruding from the third longitudinal portion of the top frame surface.

12. The network interface device of claim 11, wherein at least one of the first longitudinal portion and the second longitudinal portion of the top frame surface is disposed along a first plane positioned at a first height relative to the bottom frame surface,
wherein the third longitudinal portion of the top frame surface is disposed along a second plane positioned at a second height relative to the bottom frame surface, and
wherein the first height being higher than the second height.

13. The network interface device of claim 11, wherein the heat dissipating members extend above a plane of at least one of the first longitudinal portion and the second longitudinal portion of the top frame surface.

14. The network interface device of claim 11, wherein the heat dissipating members comprise longitudinal fins being spaced by a fin pitch with respect to each other, and wherein the fin pitch is predefined such that each of the longitudinal fins contacts one of conductive members of a receptacle cage of a data communication system when the network interface device is inserted into the receptacle cage.

15. The network interface device of claim 11, wherein the heat dissipating members comprise a zipper fins assembly.

16. The network interface device of claim 11, wherein the heat dissipating members and at least the top frame surface are formed of one piece.

17. The network interface device of claim 11, wherein the heat dissipating members are welded or soldered to the top frame surface.

18. The network interface device of claim 11, further comprising:
a data communication system connector positioned at the first frame end to connect the network interface device to a data communication system;
a cable connector positioned at the second frame end to connect a cable to the network interface device; and
comprising electronic components positioned within a hollow interior of the frame.

* * * * *